United States Patent
Cai

(10) Patent No.: US 10,411,679 B2
(45) Date of Patent: Sep. 10, 2019

(54) ULTRA-LOW VOLTAGE TWO-STAGE RING VOLTAGE-CONTROLLED OSCILLATOR APPLIED TO CHIP CIRCUIT

(71) Applicant: Aplus Microstructure Electronics Co., Ltd, Changzhou, Jiangsu (CN)

(72) Inventor: Shuihe Cai, Jiangsu (CN)

(73) Assignee: APLUS SEMICONDUCTOR TECHNOLOGIES CO., LTD., Changzhou (CN)

( * ) Notice: Subject to any disclaimer, the term of this patent is extended or adjusted under 35 U.S.C. 154(b) by 0 days.

(21) Appl. No.: 15/944,811

(22) Filed: Apr. 4, 2018

(65) Prior Publication Data

US 2019/0165772 A1    May 30, 2019

(30) Foreign Application Priority Data

Nov. 27, 2017   (CN) .......................... 2017 1 1197763

(51) Int. Cl.
  *H03K 5/00* (2006.01)
  *H03K 3/03* (2006.01)

(52) U.S. Cl.
  CPC ....... *H03K 5/00006* (2013.01); *H03K 3/0315* (2013.01); *H03K 2005/00019* (2013.01); *H03K 2005/00195* (2013.01)

(58) Field of Classification Search
  CPC ............. H03K 5/00006; H03K 3/0315; H03K 2005/00019; H03K 2005/00195
  See application file for complete search history.

(56) References Cited

U.S. PATENT DOCUMENTS

| | | | | |
|---|---|---|---|---|
| 8,610,478 B1* | 12/2013 | Walsh | .................... | H03K 5/135 327/271 |
| 2005/0264336 A1* | 12/2005 | Kang | ...................... | H03K 5/13 327/287 |
| 2008/0197932 A1* | 8/2008 | Takai | ................... | H03K 3/0322 331/57 |
| 2008/0231379 A1* | 9/2008 | Jang | ..................... | H03K 3/0315 331/57 |

* cited by examiner

*Primary Examiner* — Jeffrey M Shin
(74) *Attorney, Agent, or Firm* — Wayne & Ken, LLC; Tony Hom

(57) ABSTRACT

The present utility model relates to an ultra-low voltage two-stage ring voltage-controlled oscillator applied to a chip circuit. The oscillator includes two-stage delay units. The oscillator includes two delay units that are connected end-to-end, and adjusts a working frequency by adjusting delay time of the delay unit. The delay unit includes PMOS transistors M1, M2, M3, and M4, NMOS transistors M5, M6, M7, and M8, and a load capacitor $C_L$. The two-stage ring voltage-controlled oscillator of the present utility model uses a substrate feed forward bias structure, reduces a threshold voltage of a transistor, reduces a supply voltage, reduces power consumption, has a large tuning range, and is particularly suitable for a system that works at a low supply voltage.

1 Claim, 4 Drawing Sheets

US 10,411,679 B2

ULTRA-LOW VOLTAGE TWO-STAGE RING VOLTAGE-CONTROLLED OSCILLATOR APPLIED TO CHIP CIRCUIT

CROSS-REFERENCE TO RELATED APPLICATIONS

This application claims the benefit of priority from Chinese Application No. 201711197763.X, filed on Nov. 27, 2017. The content of the aforementioned applications, including any intervening amendments thereto, are incorporated herein by reference.

TECHNICAL FIELD

The present utility model relates to the field of oscillator technologies, and more specifically, to an ultra-low voltage two-stage ring voltage-controlled oscillator applied to a chip circuit.

BACKGROUND

A voltage-controlled oscillator is an important component module of an analog circuit and a digital circuit. The voltage-controlled oscillator may be implemented in many different manners. Compared with a conventional LC oscillator, a ring oscillator occupies a smaller chip area and has a larger tuning range. If the ring oscillator includes two-stage delays, the ring oscillator can work at a high frequency, and provide quadrature outputs.

In a modern CMOS technology, as technical features, a size and a supply voltage need to be reduced in proportion to maintain stability of a device. The ring oscillator hardly works at a 0.5 V supply voltage due to a high-threshold voltage of a transistor. Connecting a substrate of a MOS transistor to a forward bias is an effective method for reducing the threshold voltage of the transistor. In a design, a substrate forward bias technology is applied to a delay unit having a local positive feedback.

Therefore, a great progress is urgently needed in the prior art.

SUMMARY

A technical problem to be resolved by the present utility model is: in view of the foregoing disadvantage of the prior art, an ultra-low voltage two-stage ring voltage-controlled oscillator applied to a chip circuit is provided and includes two delay units that are connected end-to-end, where the oscillator adjusts a working frequency by adjusting delay time of the delay unit; and the delay unit includes PMOS transistors M1, M2, M3, and M4, NMOS transistors M5, M6, M7, and M8, and a load capacitor $C_L$.

In the ultra-low voltage two-stage ring voltage-controlled oscillator of the present utility model, substrates of the PMOS transistors M2 and M4 are grounded, substrates of the PMOS transistors M1 and M3 are connected to a control voltage Vc, gate electrodes of the PMOS transistors M1 and M3 are grounded, source electrodes of the PMOS transistors M1 and M3 are connected to a VDD, and drain electrodes of the PMOS transistors M1 and M3 are connected to gate electrodes and drain electrodes of the PMOS transistors M2 and M4; the NMOS transistor M5 and the NMOS transistor M6 are used as non-inverting and inverting differential input ends of the delay unit respectively, source electrodes and drain electrodes of the NMOS transistor M7 and the NMOS transistor M8 are connected to source electrodes and drain electrodes of the NMOS transistor M5 and the NMOS transistor M6 respectively, a gate electrode of the NMOS transistor M7 is connected to the drain electrode of the NMOS transistor M6, and a gate electrode of the NMOS transistor M8 is connected to the drain electrode of the NMOS transistor M5; the drain electrode of the NMOS transistor M5 is used as an inverting output end, the drain electrode of the NMOS transistor M6 is used as a non-inverting output end, and the output ends are connected to the load capacitor $C_L$; and substrate ends of the NMOS transistors are connected to a bias voltage $V_B$.

Implementation of the ultra-low voltage two-stage ring voltage-controlled oscillator applied to the chip circuit according to the present utility model brings about the following beneficial effects: A substrate forward bias structure is used, a threshold voltage of a transistor is reduced, a supply voltage is reduced, and power consumption is reduced; with the two-stage structure, the oscillator has a simple circuit structure, has a small area, and can be easily implemented and integrated; and compared with an LC oscillator, the circuit of the two-stage ring oscillator has a large tuning range.

BRIEF DESCRIPTION OF DRAWINGS

The following further describes the present utility model with reference to accompanying drawings and embodiments. In the drawings.

DESCRIPTION OF EMBODIMENTS

Figure 1:
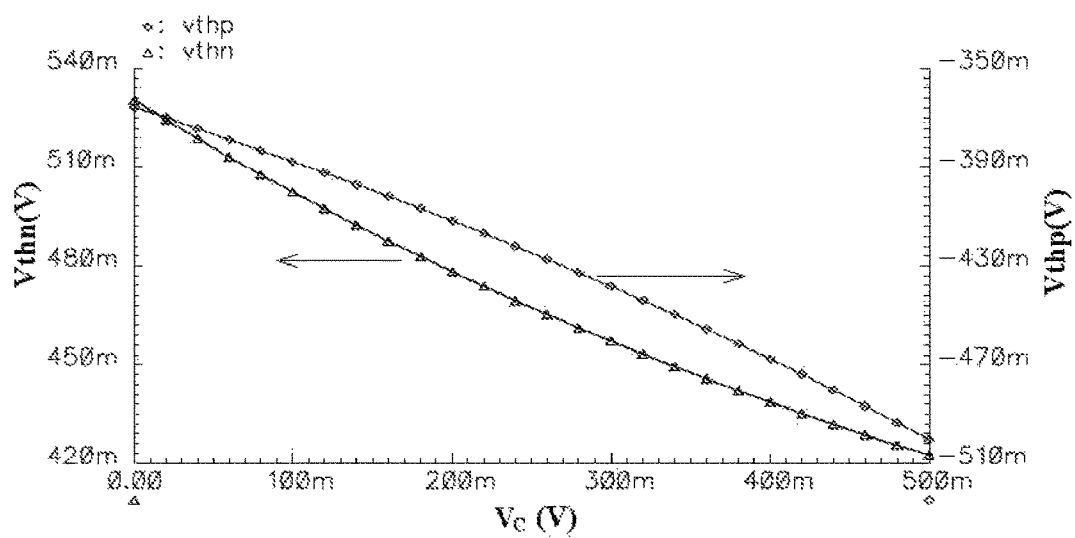
FIG. 1 is a schematic diagram in which a threshold voltage of a MOS transistor changes with a substrate bias voltage.

Referring to FIG. 1, FIG. 1 is a schematic diagram in which a threshold voltage of a MOS transistor changes with a substrate bias voltage. A substrate forward bias technology may effectively reduce the threshold voltage of the MOS transistor.

Using a 0.18 μm RF CMOS technology as an example, threshold voltages of NMOS and PMOS transistors are approximately +/−0.5 V. When a supply voltage is 0.5 V, the threshold voltage limits performance of a circuit greatly. The threshold voltage can be reduced by applying a substrate forward bias to a MOS transistor. In the 0.18 μm RF CMOS technology, a sensitive analog circuit is isolated from a substrate noise by using a deep N-well. Therefore, regardless of an NMOS transistor or a PMOS transistor connected to a substrate, the threshold voltage may be reduced by using the substrate forward bias.

The threshold voltage ($V_{thp}$) of the PMOS transistor with the substrate forward bias may be expressed as:

$$|V_{thp}| = |V_{thp0}| + \gamma(\sqrt{2|\phi_f| - V_{sb}} - \sqrt{2|\phi_f|}) \qquad (1)$$

$|V_{thp0}|$ is $|V_{thp}|$ when a source substrate voltage ($V_{sb}$) is 0, γ is a body effect coefficient, and $|\phi_f|$ is a fermi potential. Therefore, the threshold voltage $|V_{th}|$ decreases as $V_{sb}$ increases, and the threshold voltage of the PMOS transistor changes with the substrate bias voltage, as shown in FIG. 1. As can be known from FIG. 1, when the substrate bias voltage of the PMOS transistor changes from 500 mV to 0 V, the threshold voltage of the PMOS transistor changes from −500 mV to −366 mV. When the substrate bias voltage $V_c$ of the NMOS transistor changes from 0 V to 0.5 V, the threshold voltage ($V_{thn}$) of the NMOS transistor changes from 531 mV to 423 mV. This is very effective when the MOS transistor works at an ultra-low supply voltage.

Figure 2:
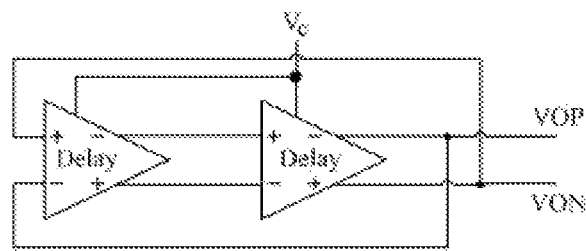
FIG. 2 is a structural diagram of an ultra-low voltage two-stage ring voltage-controlled oscillator VCO.

Referring to FIG. 2, FIG. 2 is a structural diagram of an ultra-low voltage two-stage ring voltage-controlled oscillator VCO that includes two same delay units that are connected end-to-end.

Figure 3:
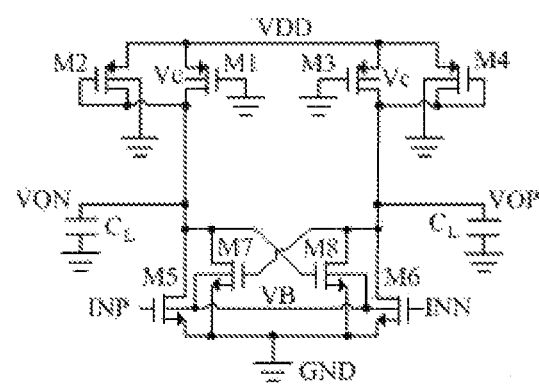
FIG. 3 is a structural diagram of a delay unit of an ultra-low voltage two-stage ring voltage-controlled oscillator.

Referring to FIG. 3, FIG. 3 is a structural diagram of a delay unit of an ultra-low voltage two-stage ring voltage-controlled oscillator. The delay unit includes PMOS transistors M1, M2, M3, and M4, NMOS transistors M5, M6, M7, and M8, and a load capacitor $C_L$. The designed ring oscillator provided by the present invention is designed based on a 0.18 μm RF technology in specific implementation. Substrates of the PMOS transistors M2 and M4 are grounded, substrates of the PMOS transistors M1 and M3 are connected to a control voltage Vc, gate electrodes of the PMOS transistors M1 and M3 are grounded, source electrodes of the PMOS transistors M1 and M3 are connected to a VDD, and drain electrodes of the PMOS transistors M1 and M3 are connected to gate electrodes and drain electrodes of the PMOS transistors M2 and M4; the NMOS transistor M5 and the NMOS transistor M6 are used as non-inverting and inverting differential input ends of the delay unit respectively, source electrodes and drain electrodes of the NMOS transistor M7 and the NMOS transistor M8 are connected to source electrodes and drain electrodes of the NMOS transistor M5 and the NMOS transistor M6 respectively, a gate electrode of the NMOS transistor M7 is connected to the drain electrode of the NMOS transistor M6, and a gate electrode of the NMOS transistor M8 is connected to the drain electrode of the NMOS transistor M5; the drain electrode of the NMOS transistor M5 is used as an inverting output end, the drain electrode of the NMOS transistor M6 is used as a non-inverting output end, and the output ends are connected to the load capacitor $C_L$; and substrate ends of the NMOS transistors are connected to a bias voltage $V_B$.

Figure 4:
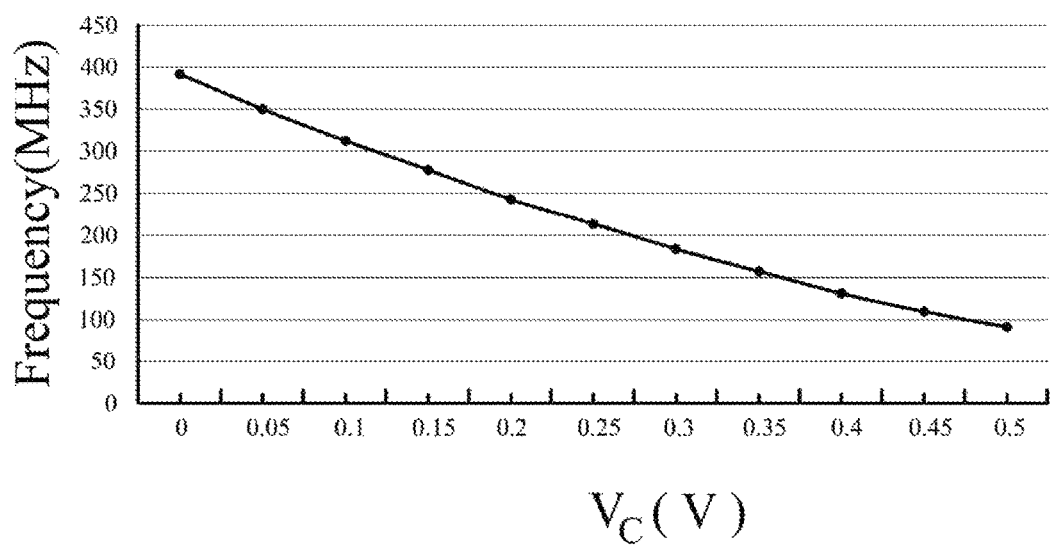
FIG. 4 is a schematic diagram in which a frequency of a voltage-controlled oscillator changes with a control voltage.

Referring to FIG. 4, FIG. 4 is a schematic diagram in which a frequency of a voltage-controlled oscillator changes with a control voltage. FIG. 4 provides a frequency change range of the voltage-controlled oscillator when the control voltage changes. As can be seen from FIG. 4, when the control voltage Vc changes from 0 V to 0.5 V, a working frequency tuning range of the VCO is from 392 MHz to 88 MHz, and a gain of the VCO is −608 MHz/V.

With the design of the foregoing embodiment of the present utility model, a substrate forward bias structure can be used, a threshold voltage of a transistor can be reduced, a supply voltage can be reduced, and power consumption can be reduced. With the two-stage structure, the oscillator has a simple circuit structure, has a small area, and can be easily implemented and integrated.

The present utility model is described according to the specific embodiment. However, a person skilled in the art should understand that various modifications and equivalent substitutions may be made to the present utility model without departing from the scope of the present utility model. In addition, to adapt to a specific scenario of the present utility model technology, modifications may be made to the present utility model without departing from the protection scope of the present utility model. Therefore, the present utility model is not limited to the specific embodiment disclosed herein, but includes all embodiments falling within the protection scope defined by the claims.

What is claimed is:

1. A two-stage ring voltage-controlled oscillator applied to a chip circuit, comprising two delay units that are connected end-to-end, wherein:

a delay time of the delay unit is adjustable; and the delay unit comprises PMOS transistors M1, M2, M3, and M4, NMOS transistors M5, M6, M7, and M8, and a load capacitor $C_L$, substrates of the PMOS transistors M2 and M4 are grounded, substrates of the PMOS transistors M1 and M3 are connected to a control voltage Vc, gate electrodes of the PMOS transistors M1 and M3 are grounded, source electrodes of the PMOS transistors M1 and M3 are connected to a VDD, and drain electrodes of the PMOS transistors M1 and M3 are connected to gate electrodes and drain electrodes of the PMOS transistors M2 and M4; the NMOS transistor M5 and the NMOS transistor M6 are used as non-inverting and inverting differential input ends of the delay unit respectively, source electrodes and drain electrodes of the NMOS transistor M7 and the NMOS transistor M8 are connected to source electrodes and drain electrodes of the NMOS transistor M5 and the NMOS transistor M6 respectively, a gate electrode of the NMOS transistor M7 is connected to the drain electrode of the NMOS transistor M6, and a gate electrode of the NMOS transistor M8 is connected to the drain electrode of the NMOS transistor M5; the drain electrode of the NMOS transistor M5 is used as an inverting output end, the drain electrode of the NMOS transistor M6 is used as a non-inverting output end, and the output ends are connected to the load capacitor $C_L$; and substrate ends of the NMOS transistors are connected to a bias voltage $V_B$.

* * * * *